(12) United States Patent
Forsyth et al.

(10) Patent No.: US 9,048,272 B2
(45) Date of Patent: Jun. 2, 2015

(54) DEVICES AND METHOD FOR HANDLING MICROELECTRONICS ASSEMBLIES

(75) Inventors: Valoris L. Forsyth, Lewisville, TX (US); Justin L. Lawrence, Meridian, ID (US); John E. Vannortwick, Kuna, ID (US); Jamie J. Wanke, Boise, ID (US); Christopher E. Casey, Meridian, ID (US); Michael R. Forbis, Meridian, ID (US); James R. Stoor, Boise, ID (US); Michael R. Slaughter, Boise, ID (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 332 days.

(21) Appl. No.: 13/054,104

(22) PCT Filed: Sep. 24, 2009

(86) PCT No.: PCT/US2009/058197
§ 371 (c)(1),
(2), (4) Date: Jun. 21, 2011

(87) PCT Pub. No.: WO2010/036790
PCT Pub. Date: Apr. 1, 2010

(65) Prior Publication Data
US 2011/0259772 A1   Oct. 27, 2011

Related U.S. Application Data

(63) Continuation-in-part of application No. 12/252,292, filed on Oct. 15, 2008, now abandoned.

(60) Provisional application No. 61/194,450, filed on Sep. 25, 2008.

(51) Int. Cl.
*B65D 85/30* (2006.01)
*H01L 21/673* (2006.01)
(Continued)

(52) U.S. Cl.
CPC ....... *H01L 21/67333* (2013.01); *B29C 45/0053* (2013.01); *B29C 65/561* (2013.01);
(Continued)

(58) Field of Classification Search
CPC ... H05K 7/1422; H05K 7/1425; H05K 7/186; H05K 7/1418; H05K 7/1429; H05K 7/1427; H04Q 2201/02; H04Q 1/06; H04Q 2201/12; G02B 6/4452; G02B 6/4471; H01L 21/67333; H01L 21/67356; H01L 21/67369; B29C 65/561; B29C 65/562; B29C 45/0053; B29C 66/5346; B29L 2012/00; B29L 2031/737
USPC ............ 211/41.17, 41.18, 26, 26.2; 206/725, 206/714, 722, 713, 557, 561, 564; 361/725–727; 220/4.02
See application file for complete search history.

(56) References Cited

U.S. PATENT DOCUMENTS 4,340,774 A * 7/1982 Nilsson et al. ............ 174/138 G
4,438,847 A * 3/1984 Fritz ............................ 206/713
(Continued)

FOREIGN PATENT DOCUMENTS

JP      05335787      12/1993
WO     2008091460     7/2008

*Primary Examiner* — Jonathan Liu
*Assistant Examiner* — Devin Barnett
(74) *Attorney, Agent, or Firm* — McCarter & English, LLP

(57) ABSTRACT

The disclosure relates to trays for the handling and shipping of computer chips, or similar microelectronic devices. The tray include a series of channels, each extending along a width of the tray. The channels include such devices as pins and clips for securing a thermoformed tape. The thermoformed tape includes pockets for storing the various computer chips, or similar microelectronic devices.

13 Claims, 14 Drawing Sheets

(51) Int. Cl.
*B29C 65/56* (2006.01)
*B29C 45/00* (2006.01)
*B29C 65/00* (2006.01)
*B29L 12/00* (2006.01)
*B29L 31/00* (2006.01)

(52) U.S. Cl.
CPC ........... *B29C65/562* (2013.01); *B29C 66/5346* (2013.01); *B29L 2012/00* (2013.01); *B29L 2031/737* (2013.01); *H01L 21/67356* (2013.01); *H01L 21/67369* (2013.01)

(56) References Cited

U.S. PATENT DOCUMENTS

| | | | | |
|---|---|---|---|---|
| 4,533,049 A * | 8/1985 | Ozeki | ............................ | 206/455 |
| 4,654,693 A * | 3/1987 | Funakoshi et al. | ............. | 269/287 |
| 5,103,976 A * | 4/1992 | Murphy | ....................... | 206/719 |
| 5,203,452 A | 4/1993 | Small et al. | | |
| 5,203,454 A | 4/1993 | Strong | | |
| 5,265,723 A * | 11/1993 | Chenoweth et al. | .......... | 206/714 |
| 5,361,901 A * | 11/1994 | Schenz et al. | ................. | 206/714 |
| 5,447,784 A * | 9/1995 | Williams et al. | .............. | 428/220 |
| 5,690,233 A * | 11/1997 | Kaneko | ......................... | 206/714 |
| 5,758,776 A * | 6/1998 | Slocum et al. | ................. | 206/714 |
| 5,848,703 A * | 12/1998 | Murphy et al. | ................. | 206/725 |
| 5,909,812 A * | 6/1999 | Thibaudeau | ................... | 206/723 |
| 5,957,293 A * | 9/1999 | Pakeriasamy | ................. | 206/725 |
| 5,967,328 A * | 10/1999 | Ziberna | ......................... | 206/714 |
| 6,016,918 A * | 1/2000 | Ziberna | ......................... | 206/714 |
| 6,036,023 A * | 3/2000 | Pfahnl et al. | ................... | 206/725 |
| 6,056,124 A * | 5/2000 | Kaneko | ......................... | 206/714 |
| 6,071,056 A * | 6/2000 | Hollowell | ..................... | 414/405 |
| 6,076,681 A * | 6/2000 | Chenoweth | ................... | 206/714 |
| 6,109,445 A * | 8/2000 | Beyer | ............................. | 206/714 |
| 6,116,427 A * | 9/2000 | Wu et al. | ........................ | 206/706 |
| 6,168,026 B1 * | 1/2001 | Haggard et al. | ............... | 206/714 |
| 6,497,932 B1 * | 12/2002 | Munch et al. | ................. | 428/34.1 |
| 6,557,707 B1 * | 5/2003 | Yen | ................................ | 206/714 |
| 6,612,442 B2 * | 9/2003 | Soh et al. | ....................... | 206/725 |
| 6,688,472 B2 * | 2/2004 | Hong et al. | .................... | 206/714 |
| 6,729,474 B2 * | 5/2004 | Hong et al. | .................... | 206/714 |
| 6,868,970 B2 * | 3/2005 | Gardiner et al. | ............... | 206/725 |
| 6,907,993 B2 * | 6/2005 | Wang | ............................ | 206/725 |
| 6,967,846 B2 * | 11/2005 | Chen | .............................. | 361/715 |
| 7,135,703 B2 * | 11/2006 | Ham et al. | ...................... | 257/48 |
| 7,228,622 B2 * | 6/2007 | Watson | .......................... | 29/827 |
| 7,410,060 B2 * | 8/2008 | Crisp | ............................. | 206/706 |
| 7,476,960 B2 * | 1/2009 | Cruz et al. | ...................... | 257/678 |
| 7,757,862 B2 * | 7/2010 | Tamura et al. | ................. | 206/725 |
| 8,116,082 B2 * | 2/2012 | Beaudoin et al. | .............. | 361/724 |
| 8,221,601 B2 * | 7/2012 | Chen et al. | ............... | 204/297.06 |
| 2002/0066694 A1 * | 6/2002 | Soh et al. | ....................... | 206/725 |
| 2002/0148753 A1 * | 10/2002 | Egami | ............................ | 206/564 |
| 2003/0085150 A1 * | 5/2003 | Yen | ................................ | 206/714 |
| 2003/0102249 A1 * | 6/2003 | Lee | ................................ | 206/725 |
| 2003/0209466 A1 * | 11/2003 | Kunii et al. | ..................... | 206/725 |
| 2004/0000504 A1 * | 1/2004 | Wang | ............................ | 206/725 |
| 2004/0206661 A1 * | 10/2004 | Gardiner et al. | ............... | 206/701 |
| 2004/0232037 A1 * | 11/2004 | Susaki | .......................... | 206/713 |
| 2005/0133404 A1 * | 6/2005 | White | ............................ | 206/725 |
| 2005/0269242 A1 | 12/2005 | Crisp | | |
| 2006/0118457 A1 * | 6/2006 | Kawasaki | ....................... | 206/713 |
| 2006/0175225 A1 * | 8/2006 | Ho | ................................ | 206/564 |
| 2006/0283773 A1 * | 12/2006 | Ho et al. | ........................ | 206/725 |
| 2007/0062844 A1 * | 3/2007 | Velasquez Urey et al. | ... | 206/714 |
| 2007/0074996 A1 * | 4/2007 | Nice et al. | ..................... | 206/714 |
| 2007/0163920 A1 * | 7/2007 | Sasaki | .......................... | 206/725 |
| 2007/0215517 A1 * | 9/2007 | Holler | .......................... | 206/725 |
| 2007/0256958 A1 * | 11/2007 | Zhang et al. | .................. | 206/725 |
| 2008/0073245 A1 * | 3/2008 | Andrews | ....................... | 206/723 |
| 2008/0121561 A1 * | 5/2008 | An et al. | ........................ | 206/725 |
| 2008/0173569 A1 * | 7/2008 | Forsyth | ......................... | 206/725 |
| 2008/0296201 A1 * | 12/2008 | Lalouch et al. | ............... | 206/714 |
| 2009/0050519 A1 * | 2/2009 | Tamura et al. | ................. | 206/712 |
| 2010/0089851 A1 * | 4/2010 | Slaughter et al. | ........... | 211/126.2 |
| 2011/0132789 A1 * | 6/2011 | Peng et al. | ..................... | 206/505 |
| 2011/0290701 A1 * | 12/2011 | Bennett et al. | ................ | 206/725 |

* cited by examiner

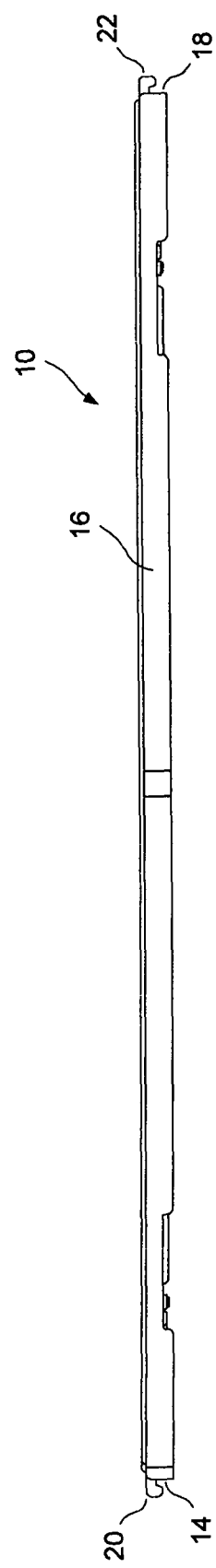
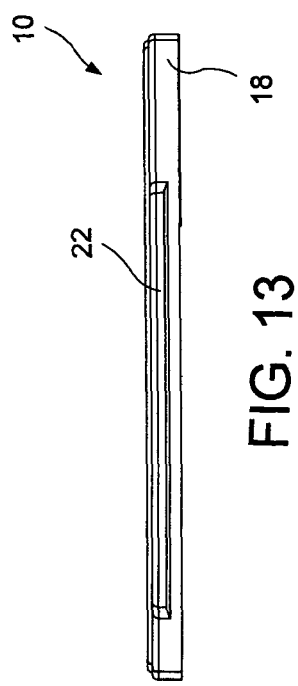
FIG. 12
FIG. 13

DEVICES AND METHOD FOR HANDLING MICROELECTRONICS ASSEMBLIES

This application is a continuation-in-part of U.S. application Ser. No. 12/252,292 filed on Oct. 15, 2008. This application further claims priority under 35 U.S.C. §119(e) of U.S. provisional application Ser. No. 61/194,450 filed Sep. 25, 2008.

BACKGROUND OF THE INVENTION

1. Field of the Disclosure

The present disclosure relates to devices and methods for handling microelectronic assemblies. In particular, the present disclosure is related to devices, such as trays, and methods for handling packaged microelectronic devices or assemblies, non-packaged microelectronic devices or assemblies, or image sensor devices or assemblies.

2. Description of the Prior Art

Typically, trays can be used to reduce damage to microelectronic assemblies, such as memory device and microprocessors, and to increase the efficiencies in handling and shipping microelectronic assemblies. The Joint Electron Device Engineering Council (JEDEC) has promulgated design requirements to standardize trays used by the microelectronic assembly manufacturers and customers. For example, JEDEC Publication 95, Design Guide 4.10, "Generic Shipping & Handling Matrix Tray", standardizes the physical and functional characteristics of the trays, including the length width, thickness, capacity, stackability, and other characteristics of the trays.

SUMMARY AND OBJECTS OF THE INVENTION

It is therefore an object of the present invention to provide an improvement in the trays for storing and transporting computer chips, or other microelectronic assemblies, increasing the efficiency of the handling and shipping thereof.

It is therefore a further object of the present invention to provide a tray within JEDEC standards with respect to outer stacking rail standards.

These and other objectives are attained by providing a tray with a series of channels, each typically formed along the width of the tray. Each channel includes elements, typically pins and clips, for securing a thermoformed tape therewithin. The tape includes thermoformed pockets for containing the computer chips, or other microelectronic assemblies. A tape on the lower side of an upwardly adjacent tray can be provided without pockets in order to capture the computer chip more effectively. In this manner, different sizes and shapes of computer chips can be accommodated by the same tray, merely by changing some or all of the thermoformed tapes included therein.

The resulting tray has many uses, including transporting new design, technology, or function devices within the semiconductor market. Further, the resulting tray meets needs developed in the prototype phase of product introduction with subsequent high volume requirements met by hard-tooled trays and production volumes of tape.

BRIEF DESCRIPTION OF THE DRAWINGS

Further objects and advantages of the invention will become apparent from the following description and from the accompanying drawing, wherein:

FIG. 12 is a side plan view of the still further embodiment of the handling device of the present disclosure.

FIG. 13 is an end plan view of the still further embodiment of the handling device of the present disclosure.

DETAILED DESCRIPTION OF THE PREFERRED EMBODIMENTS

Specific details of several embodiments of the disclosure are described below with reference to microelectronic assembly handling devices and methods for handling microelectronic assemblies. As it is used in the present disclosure, the phrase "microelectronic assemblies" can include packaged microelectronic assemblies or devices, bare dies and other non-packaged microelectronic assemblies or devices, image sensor assemblies and devices, or other semiconductor components. Packaged microelectronic assemblies can include, for example, micromechanical components, data storage elements, optics, read/write components, or other features. Non-packaged microelectronic assemblies can include, for example, microelectronic dies for flash memory (e.g., NAND flash memory), SRAM, DRAM (e.g., DDR-SDRAM), processors, imagers, and other types of devices. The term "handling" can include a manual or automated method or process by which something is moved, carried, transported, delivered, shipped, worked-on, or otherwise manipulated in connection with microelectronic assemblies. The phrase "coupled" can include a physical association or structural linking of two or more components or features. Other embodiments according to the disclosure can have configurations, components, features or procedures different than those described in this section. A person of ordinary skill in the relevant art, therefore, will accordingly understand that the disclosure may have other embodiments with additional elements, or the disclosure may have other embodiments without several of the elements shown and described below with reference to FIGS. 1-15.

Figure 1:
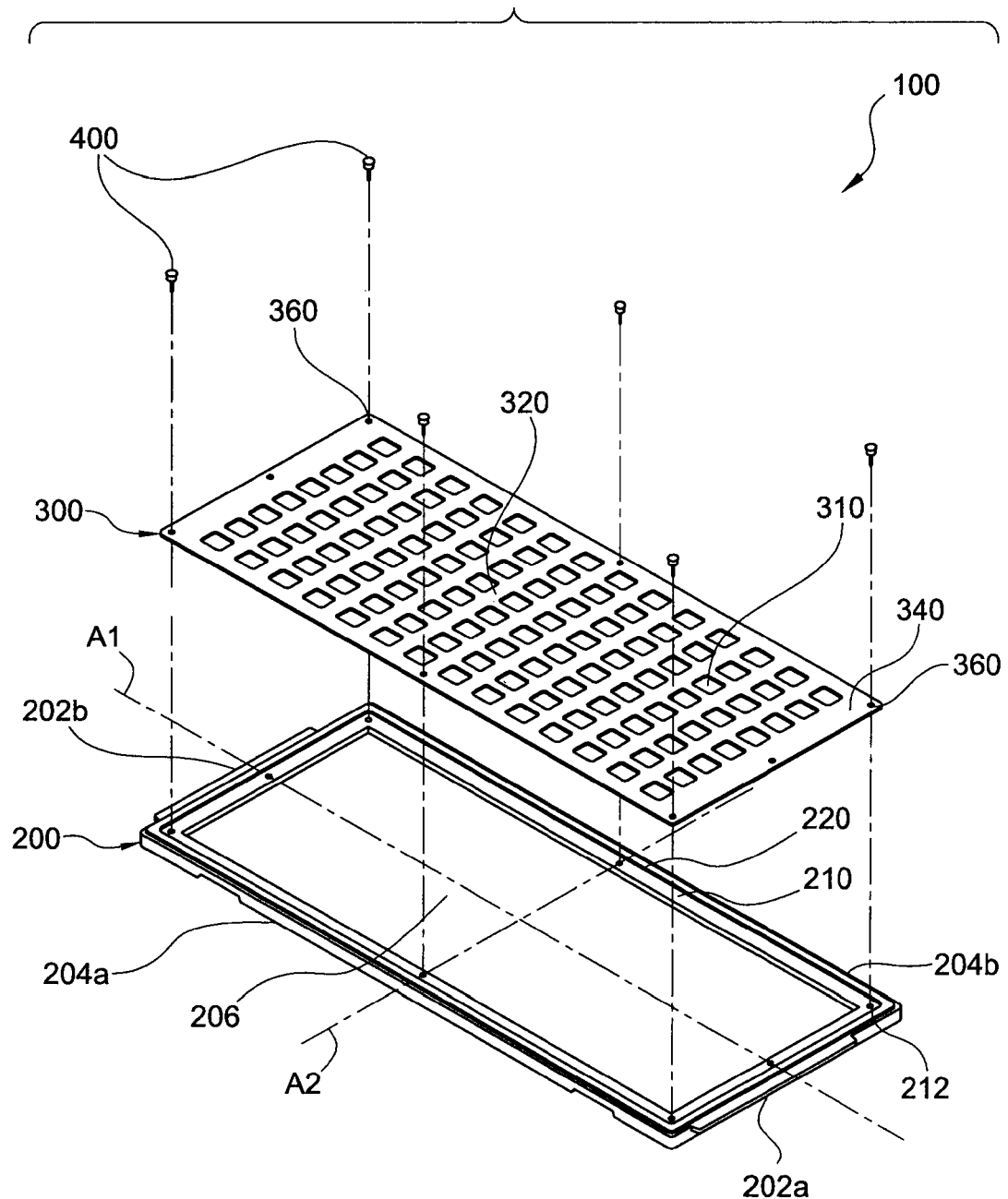
FIG. 1 is an exploded perspective view of a handling device for microelectronic assemblies in accordance with an embodiment of the disclosure.

FIG. 1 is an exploded perspective view of a handling device 100 for microelectronic assemblies in accordance with an embodiment of the disclosure. The handling device 100 can include a frame 200, an insert (e.g., an insert panel) 300, and one or more retainers 400 that releasably secure the frame 200 and the insert panel 300.

In the embodiment shown in FIG. 1, the frame 200 has a rectangular shape and size in accordance with JEDEC design requirements. According to other embodiments, a frame can have other suitable shapes and/or sizes. The frame 200 includes a first end portion 202a and a second end portion 202b. The second end portion 202b is spaced along a longitudinal axis A1 from the first end portion 202a. The frame 200 also includes a first side portion 204a and a second side portion 204b. The second side portion 204b is spaced along a lateral axis A2 from the first side portion 204a. The first and second end portions 202a and 202b and the first and second side portions 204a and 204b define a platform 210 positioned around an aperture 206 to support the insert panel 300, and the frame 200 also includes a rim 220 that projects from the platform 210 to position the insert panel 300 on the platform 210.

Embodiments of the frame 200 are configured to be formed as a unitary construction of a homogeneous material. For example, the frame 200, including the first and second end portions 202a and 202b, the first and second side portions 204a and 204b, and the rim 220, can be injection molded of carbon fiber or another material having suitable resistivity/conductivity and static dissipative properties. In other embodiments, other suitable methods and materials can be used to form the frame 200 as a unitary construction of a homogeneous material. In still further embodiments of the present disclosure, a frame can include multiple pieces, possibly of diverse materials, that are assembled to form an integral construction.

The insert panel 300 includes a plurality of pockets 310. Individual pockets 310 are configured to releasably receive a respective microelectronic assembly (not shown in FIG. 1). According to other embodiments of the present disclosure, the pockets 310 can be configured to receive other microelectronic components, e.g., bare chips or wafer portions. The plurality of pockets 310 can be distributed over the insert panel 300 in a plurality of rows and in a plurality of columns. As shown in FIG. 1, individual rows extend parallel to the longitudinal axis A1 and individual columns extend parallel to the lateral axis A2. In other embodiments of the present disclosure, the pockets 310 can have any suitable distribution over the insert panel 300 that is in compliance with JEDEC Design Guide 4.10, for example.

The insert panel 300 can be thermoformed in particular embodiments of the disclosure. As it is used in the present disclosure, the term "thermoform" includes a manufacturing process wherein a thermoplastic sheet or film is heated to its forming temperature before being stretched into or onto a mold and then cooled. Examples of thermoforming in accordance with the present disclosure can include vacuum forming, pressure forming, or a combination thereof. The insert panel 300 can include any suitable thermoplastic material, including tri-laminate polystyrene. According to other embodiments of the present disclosure, the plurality of pockets 310 can be formed by stamping, machining, e.g., stereolithography, or any other suitable process.

The insert panel 300 includes a central region 320 and a peripheral region 340. The central region 320 includes the pockets 310 and the peripheral region 340 overlies the platform 210. The peripheral region 340 can include a plurality of holes 360 through which the retainers 400 extend so as to secure the insert panel 300 to the frame 200.

Continuing to refer to FIG. 1, the retainers 400 are used to releasably secure the insert panel 300 to the frame 200. The retainers 400 can be changed between a coupled arrangement (not shown in FIG. 1) and a decoupled arrangement. In the coupled arrangement, the retainers 400 secure the insert panel 300 to the frame 200 so as to prohibit or at least restrict relative movement between the frame 200 and the insert panel 300. In the decoupled arrangement shown in FIG. 1, the retainers 400 allow the insert plate 300 to be released from the frame 200 so as to permit relative movement, e.g., separation, between the frame 200 and the insert plate 300.

In the embodiment shown in FIG. 1, the retainers 400 can include threaded fasteners, e.g., screws or bolts, which pass through the holes 360 in the peripheral region 340 of the insert panel 300 and threadably engage with threaded receptacles 212 in the frame 200. In other embodiments according to the present disclosure, the retainers 400 can include clips, adhesive, threaded posts, projections carried by the frame 200, or any other suitable releasable fastener. In still other embodiments according to the present disclosure, the insert panel 300 can be retained with respect to the frame 200 without separate fasteners, e.g., via a releasable friction fit between the insert panel 300 and the frame 200. In such a case, the retainer can include mating features, e.g., contact surfaces on the frame 200 and the insert panel 300. In still further embodiments, the frame 200 and the insert panel 300 can be connected via other techniques, e.g., welding.

Figure 2:
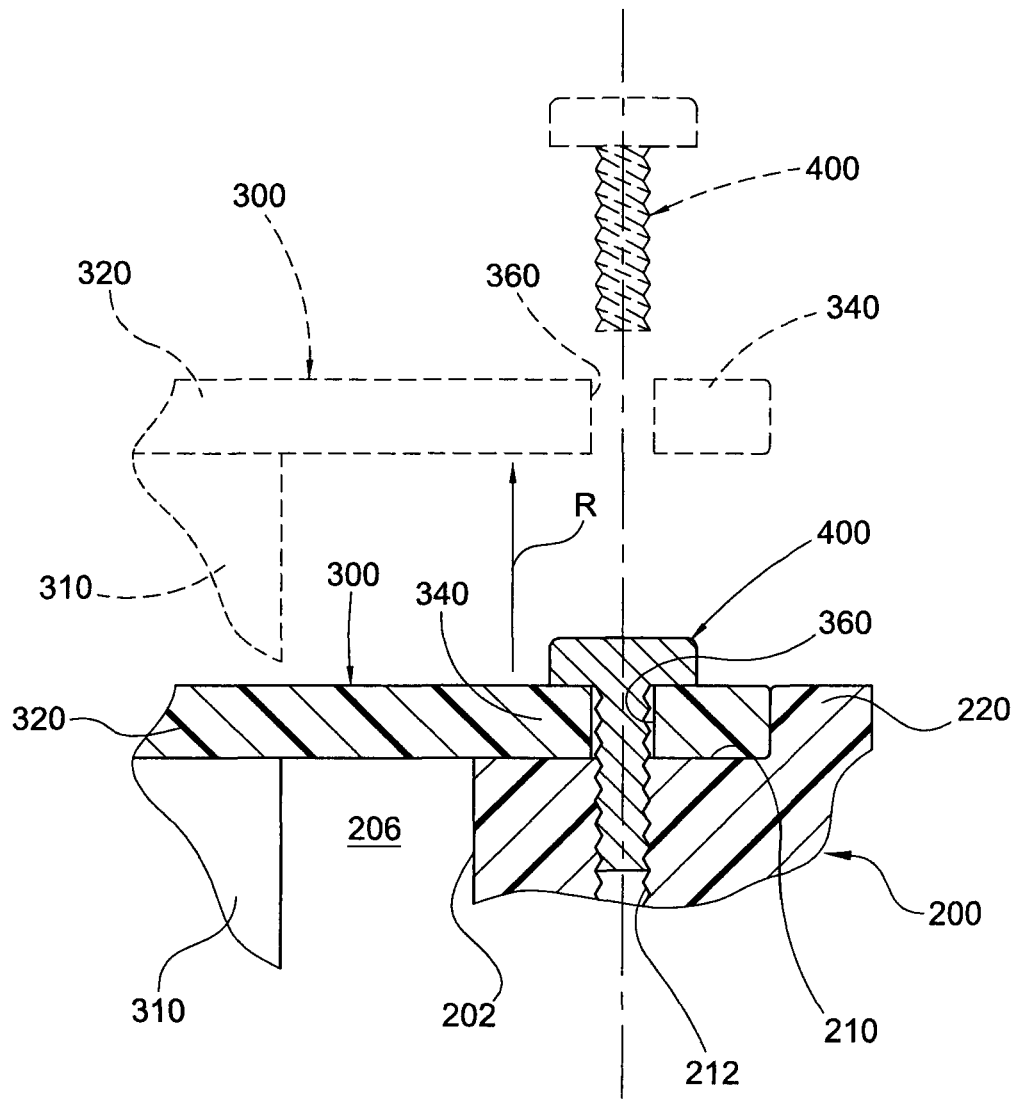
FIG. 2 is a cross-sectional view illustrating a secured configuration and a released configuration of an insert panel with respect to a portion of the frame for the handling device shown in FIG. 1.

FIG. 2 is a cross-sectional view illustrating a secured configuration (solid lines) and a released configuration (broken lines) of the insert panel 300 with respect to a portion of the frame 200 in accordance with an embodiment of the present disclosure. In the secured configuration, the peripheral region 340 of the insert panel 300 overlies the platform 210 of the frame 200. The rim 220 of the frame 200 positions the insert panel 300 on the platform 210 so that the holes 360 are approximately aligned with the threaded receptacles 212. The insert panel 300 is disposed across the aperture 206 and the pockets 310 project into the aperture 206. In the embodiment shown in FIG. 2, an individual threaded retainer 400 passes through an individual hole 360 in the insert panel 300 and threadably engages an individual threaded receptacle 212. In the released configuration, the individual threaded retainer 400 is withdrawn from the individual threaded receptacle 212 and the insert panel 300 can be separated from the frame 200 in a release direction R.

The insert panel 300, which includes 112 pockets 310 as shown in FIG. 1, can be released from the frame 200 of the handling device 100, and a different insert panel (not shown) can be secured to the frame 200 in its place. The insert plate 300 can be released from the frame 200, for example, when the retainers 400 are in the decoupled arrangement, and a different insert panel can be secured to the frame 200 by repositioning the retainers 400 in the coupled arrangement. Accordingly, the handling device 100 can facilitate using multiple types of insert panels with different numbers, sizes and distributions of pockets, all supported by the same frame 200.

Figure 3:
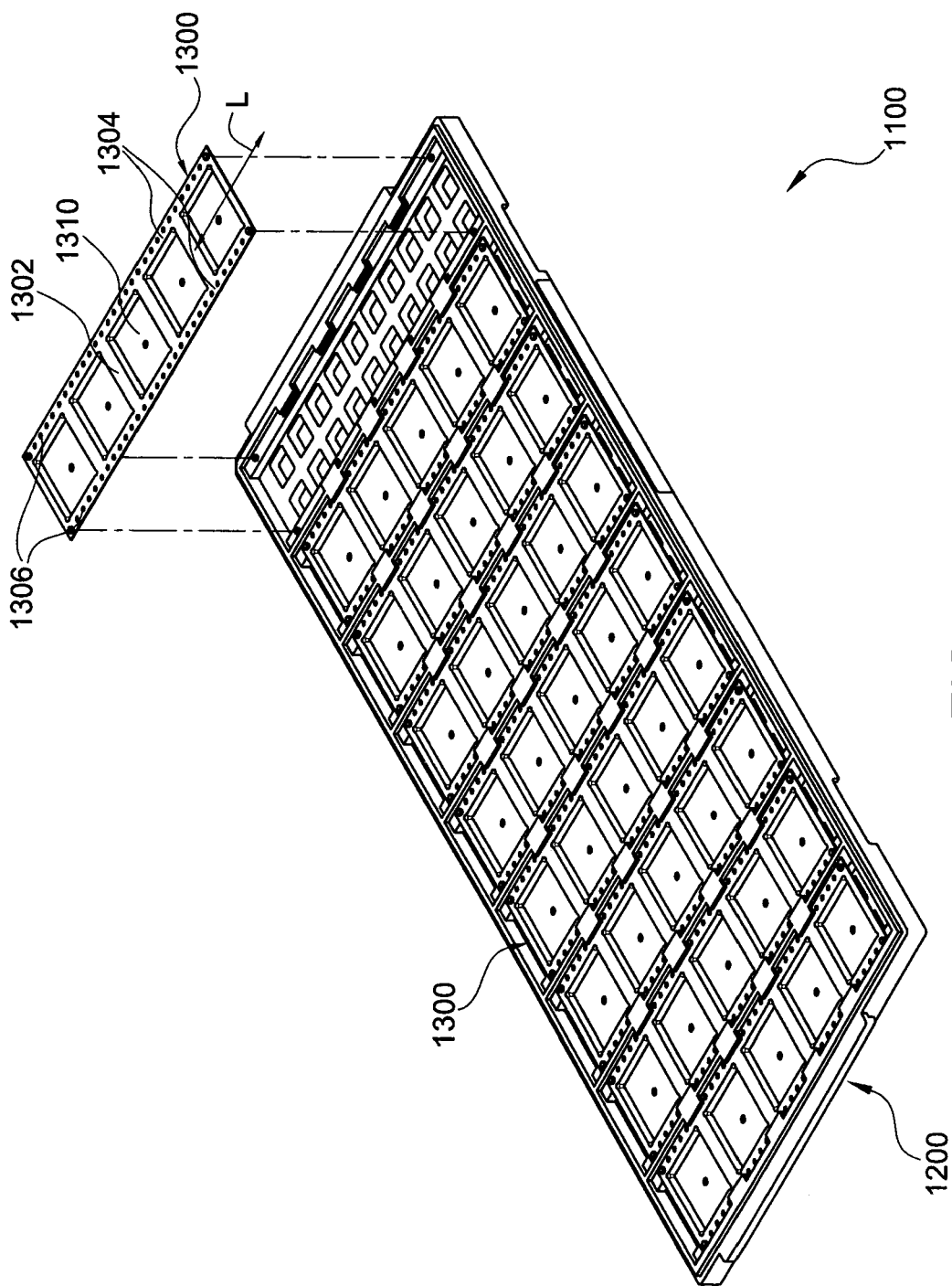
FIG. 3 shows a perspective view of a handling device for microelectronic assemblies in accordance with another embodiment of the disclosure.

FIG. 3 shows a microelectronic assembly handling device 1100 configured in accordance with another embodiment of the disclosure. In this embodiment, the handling device 1100 includes a frame 1200 that is populated with a different insert than is shown in FIG. 1, e.g., eight insert strips 1300. A ninth insert strip 1300 is shown spaced above the frame 1200 and enlarged for explanatory purposes.

Individual insert strips 1300 include a central region 1302 and two side regions 1304. The central region 1302 includes a plurality of pockets 1310 that can be configured to receive respective microelectronic assemblies. The insert strips 1300 can be lengths of embossed carrier tape, for which the Electronics Industries Alliance (EIA) has promulgated standards. For example, Standard EIA-481-B, "8 mm through 200 mm Embossed Carrier Taping and 8 mm & 12 mm Punched Carrier Taping of Surface Mounted Components for Automatic Handling," provides dimensions and tolerances necessary to tape surface mount components such that they may be automatically handled. In the embodiment shown in FIG. 3, a single column of five pockets 1310 is disposed along an individual insert strip 1300. In other embodiments, the shape, size, capacity and other characteristics of the insert strips 1300 can be different.

The peripheral regions 1304 extend parallel to a lengthwise direction L1 of the insert strips 1300 and are disposed laterally outside of the pockets 1310 on either side of an individual insert strip 1300. A set of holes 1306 can be disposed in individual peripheral regions 1304.

The insert strips 1300, similar to the insert panel 300 described above, can be thermoformed. Accordingly, the foregoing examples of thermoforming in accordance with the present disclosure (vacuum forming, pressure forming, or a combination thereof) can be used to form the insert strips 1300. The insert strips 1300 can include any suitable thermoplastic material, including tri-laminate polystyrene. According to other embodiments of the present disclosure, the plurality of pockets 1310 can be formed by stamping, machining, e.g., stereolithography, or another suitable process.

Figure 4:
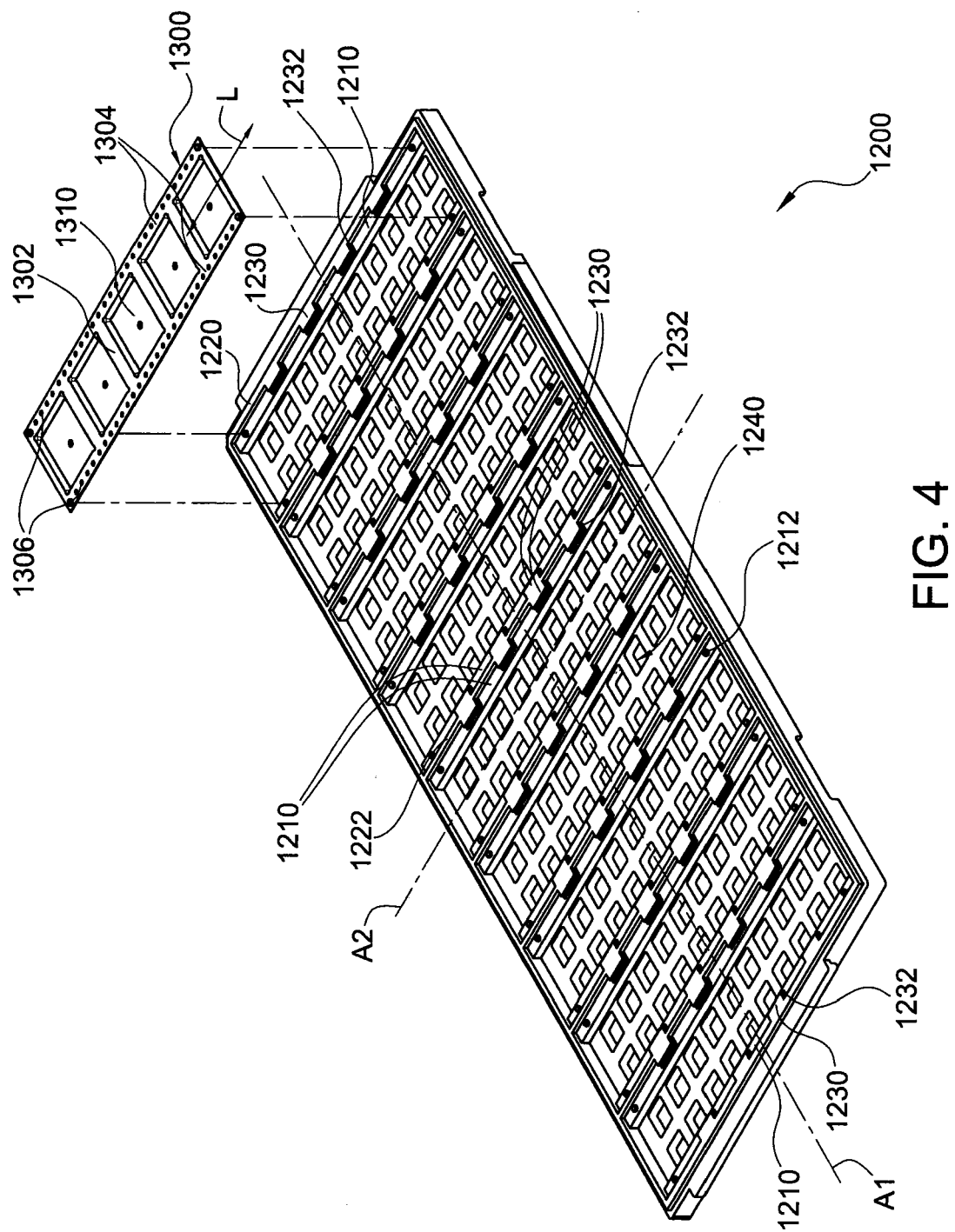
FIG. 4 is a perspective view of a frame for the handling device shown in FIG. 3.

FIG. 4 shows the frame 1200 of the handling device 1100 that is shown in FIG. 3, with the insert strips 1300 removed. According to the embodiment shown in FIG. 4, the frame 1200 has a rectangular shape and size in accordance with JEDEC design requirements. According to other embodiments, the frame can have other suitable shapes and/or sizes. The frame 1200 includes ledges 1210 to support peripheral regions 1304 of the insert strips 1300 and includes a rim 1220 for positioning the insert strips 1300 on the frame 1200.

The ledges 1210 of the frame 1200 can be spaced along a longitudinal axis A1 and extend parallel to a lateral axis A2. In the embodiment shown in FIG. 4, there are 18 ledges 1210 (only four are indicated in FIG. 4 for the sake of clarity) so as to correspond to the number of peripheral regions 1304 for nine insert strips 1300. The outer rectangular shape of the frame 1200 is interiorly partitioned by eight pairs of the ledges 1210, and each of the eight interior pairs of the ledges 1210 is separated by a respective rib 1222 (only one is indicated in FIG. 4 for the sake of clarity). The rim 1220 and the ribs 1222 position individual insert strips 1300 on the frame 1200. The spacing along the longitudinal axis A1 between adjacent ones of the rim 1220 and the ribs 1222 corresponds to a width of individual insert strips 1300, i.e., measured transversely to the lengthwise direction L of the insert strips 1300. According to other embodiments, different numbers of ledges and ribs can be disposed interiorly of a rectangular frame to accommodate different numbers and/or widths of insert strips.

The frame 1210 can also include tabs 1230 that can project parallel to the longitudinal axis A1. The tabs 1230 (only four are indicated in FIG. 4 for the sake of clarity) project from the rim 1220 and the ribs 1222 to define gaps 1232 between the tabs 1230 and respective ledges 1210. The gaps 1232 are configured to receive the peripheral regions 1304 of individual insert strips 1300. In other embodiments according to the present disclosure, any suitable structure other than the tabs 1230 can be used to prevent or at least restrict separation of individual insert strips 1300 from the frame 1200. Posts 1212 can project from the ledges 1210 for registering, e.g., locating, the insert strips 1300 with respect to the frame 1200. In the embodiment shown in FIG. 4, the tabs 1230 can prevent or at least restrict the insert strips 1300 from separating from the frame 1200 and the posts 1212 can prevent or at least restrict the insert strips 1300 from sliding on the frame 1200. In other embodiments of the present disclosure, the insert strips 1300 can be pressed onto several of the posts 1210 such that the insert strips 1300 are retained with respect to the frame 1210 via a friction fit without the tabs 1230.

In the embodiment shown in FIG. 4, the frame 1200 can include a grid 1240 that can underlie the ledges 1210 relative to the tabs 1230. The grid 1240 can contiguously support the bottom surfaces of the pockets 1310 of the insert strips 1300. According to other embodiments, any suitable structure other than the grid 1240 can be used to provide support for pockets.

The frame 1200, similar to the frame 200 described above, can be formed as a unitary construction of a homogeneous material. For example, the frame 1200, including the ledges 1210, the posts 1212, the rim 1220, the ribs 1222, the tabs 1230 and the grid portion 1240 can be injection molded of carbon fiber or another material having suitable resistivity/conductivity and static dissipative properties. In other embodiments, other suitable methods and materials can be used to form the frame 1200 as a unitary construction of a homogeneous material. In still further embodiments of the present disclosure, a frame can include multiple pieces, possibly of diverse materials, that are assembled to form an integral construction.

Figure 5:
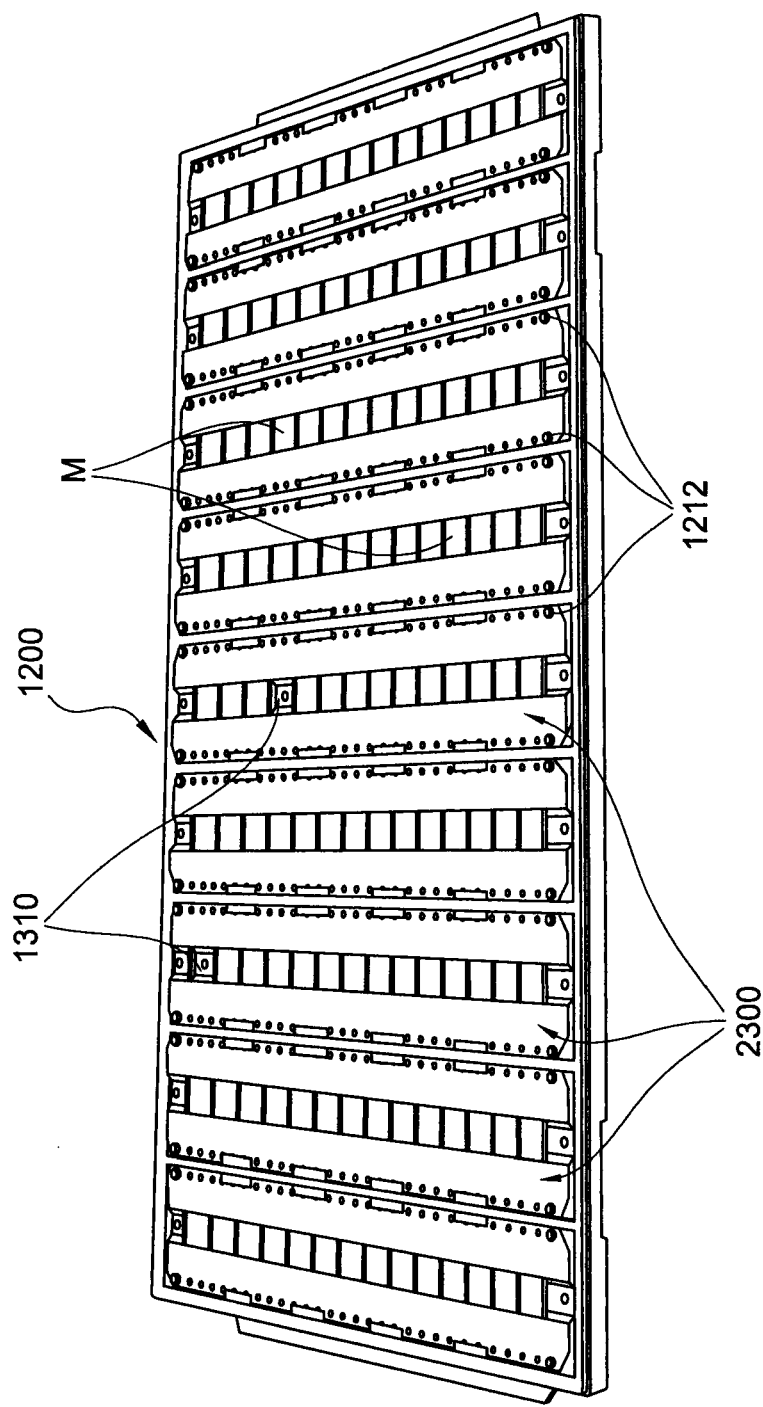
FIG. 5 is a perspective view of a handling device carrying microelectronic assemblies in accordance with yet another embodiment of the disclosure.

FIG. 5 shows another embodiment according to the present disclosure that includes insert strips 2300 supported by the same frame 1200 and microelectronic assemblies M (only two are indicated in FIG. 5 for the sake of clarity) disposed in individual pockets 1310. In the embodiment shown in FIG. 5, 14-pocket insert strips 2300 have been secured to the frame 1200 in place of the five-pocket insert strips 1300 shown in FIG. 3. In particular, individual insert strips 1300 that include five pockets 1310, as shown in FIG. 3, have been released from the frame 1200, and individual insert strips 2300 that include 14 pockets, as shown in FIG. 5, have been secured to the frame 1200. Accordingly, the number, size, and other characteristics of pockets included in an inset strip can be varied to accommodate various microelectronic assemblies and/or components while the same frame can be used to support the different insert strips.

Figure 6:
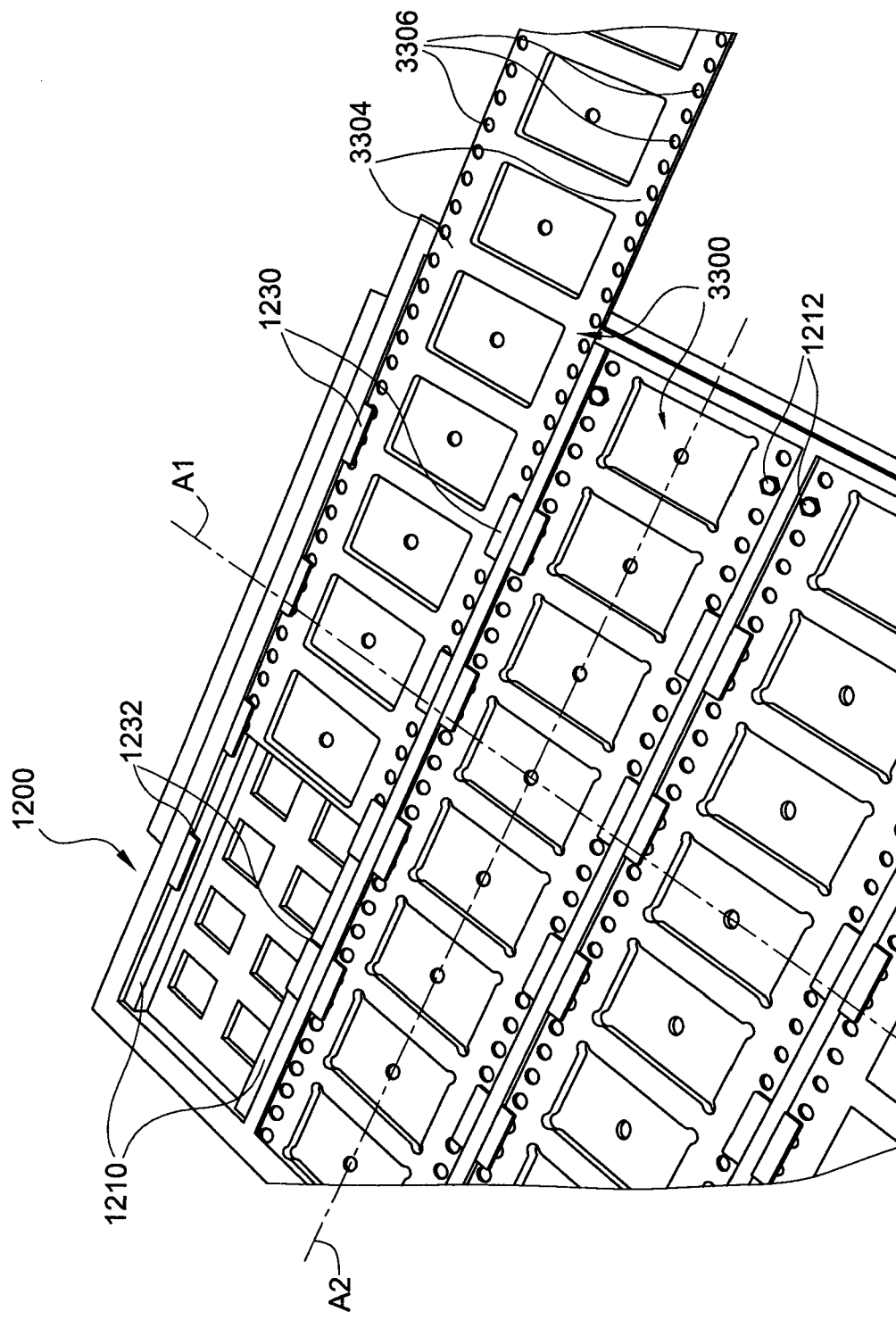
FIG. 6 is an enlarged view of a portion of a handling device for microelectronic assemblies in accordance with a further embodiment of the disclosure.

FIG. 6 is an enlarged view of a portion of a handling device similar to that shown in FIG. 3, with eight-pocket (rather than five-pocket) insert strips 3300 installed. With reference to FIG. 6, a method by which insert strips can be secured and released, thereby facilitating changing insert strips while still using the same frame, will now be described. To secure individual insert strips 3300 to the frame 1200, the insert strip 3300 can be displaced in the direction parallel to the lateral axis A2 between the ledges 1210 and the tabs 1230 so as to dispose side regions 3304 of the insert strip 3300 in the gaps 1232. At least one hole 3306 in the insert strip 3300 can then be pressed over a post 1212 to secure the insert strip 3300 on the frame 1200. To release an insert strip 3300 from the frame 1200, the insert strip 3300 is displaced, e.g., lifted, such that the posts 1212 no longer engage holes 3306 in the insert strip 3300 and the insert strip 3300 is displaced in its lengthwise direction so as to extricate side regions of the insert strip from the gaps 1232. According to other embodiments, insert strips with different numbers, sizes, distributions, or other characteristics of pockets can all be installed on the same frame 1200.

Figure 7:
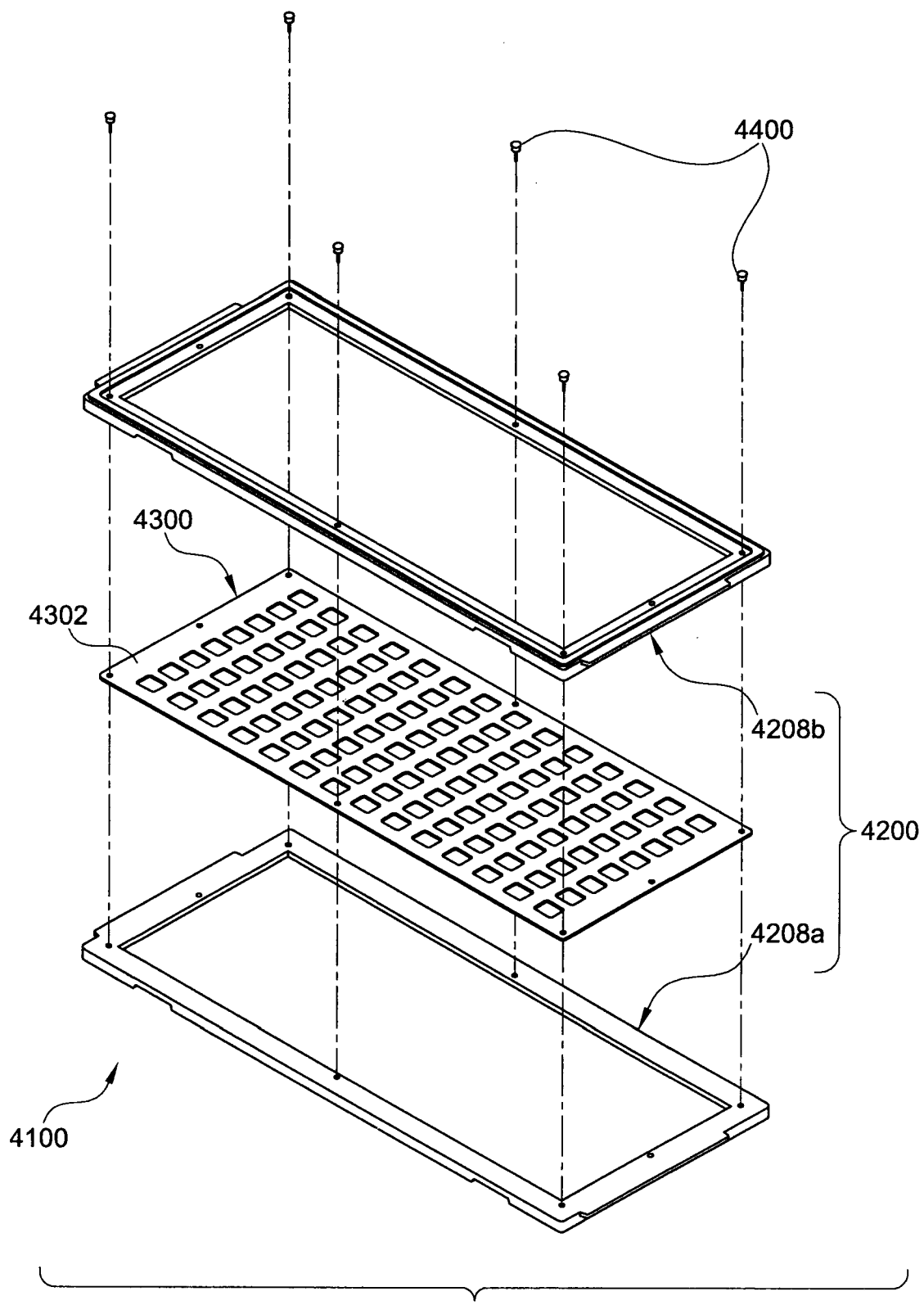
FIG. 7 is an exploded perspective view of a handling device for microelectronic assemblies in accordance with yet a further embodiment of the disclosure.

FIG. 7 is an exploded, schematic illustration of a microelectronic assembly handling device 4100 configured in accordance with an embodiment of the disclosure. In this embodiment, the handling device 4100 includes a frame 4200, an insert plate 4300, and one or more retainers 4400. In particular, the insert plate 4300 includes a peripheral region 4302 sandwiched between first and second sections 4208a and 4208b of the frame 4200, and the retainers 4400 releasably secure together the first and second sections 4208a and 4208b of the frame 200 with the insert plate 4300 sandwiched between.

Figure 8:
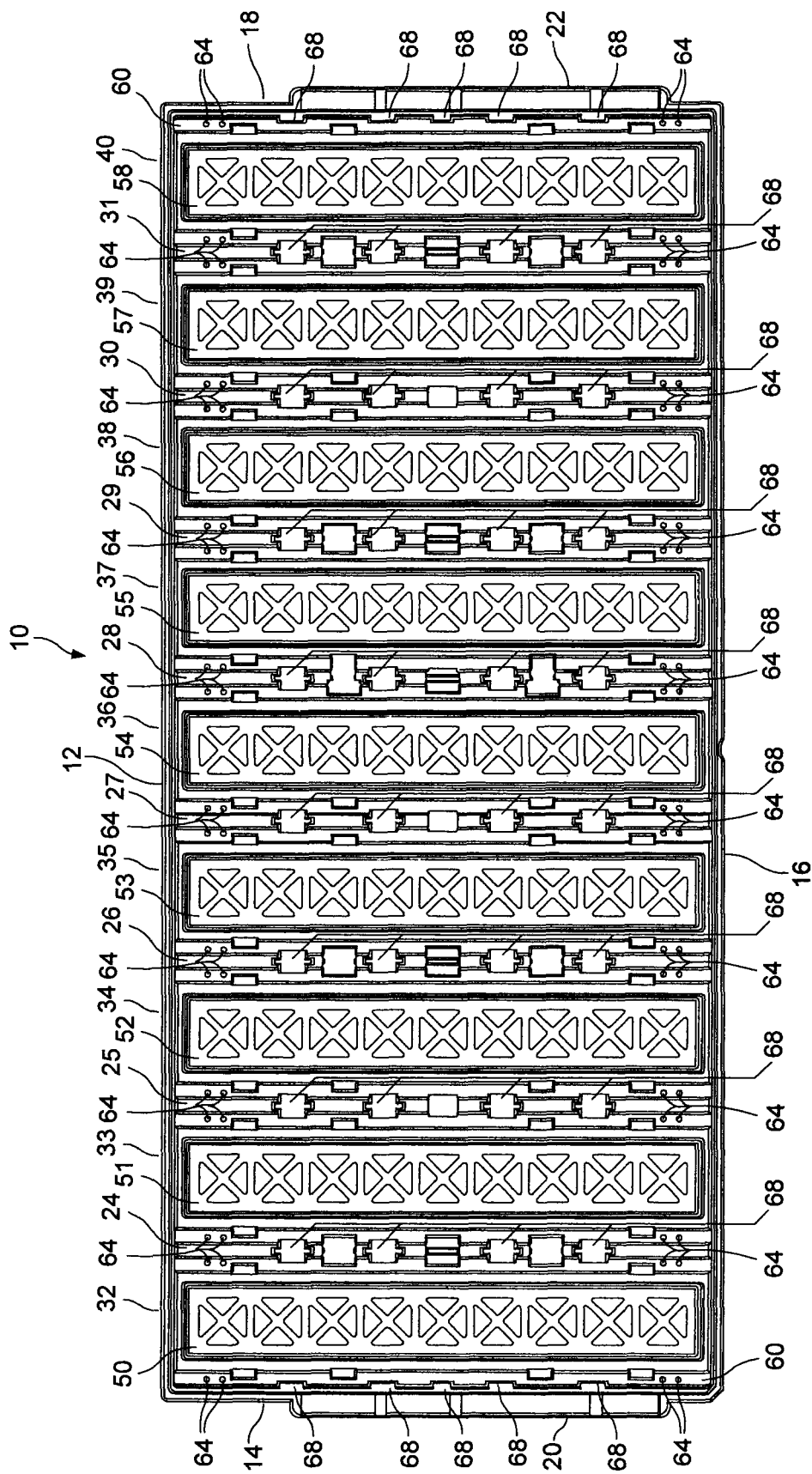
FIG. 8 is a top plan view of a still further embodiment of the handling device of the present disclosure.
Figure 9:
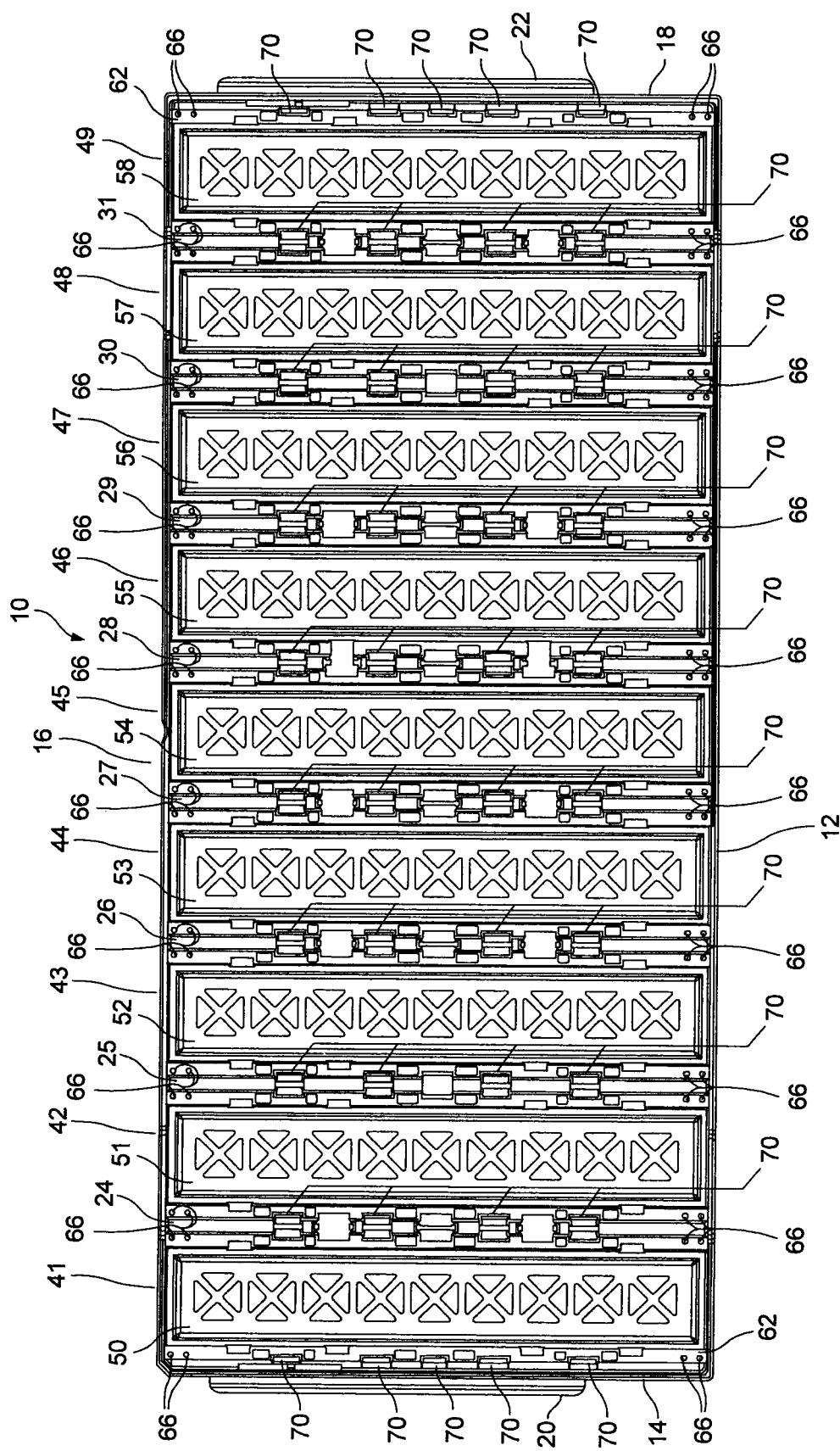
FIG. 9 is a bottom plan view of the still further embodiment of the handling device of the present disclosure.

FIGS. 8 and 9 are top and bottom plan views, respectively, of an embodiment of the tray or handling device 10 of the present disclosure. Tray or handling device 10 is configured and arranged for the storage and transportation of non-packaged microelectronic devices, which may be referred to collectively as the computer chips 250 illustrated in FIG. 10. Tray 10 is of a generally rectangular shape, typically in accordance with JEDEC standards with respect to outer stacking rail standards, with a frame formed by relatively longer first and second sides 12, 16 (see FIG. 12) and relatively shorter first and second ends 14, 18 (see FIG. 13). Extended lips 20, 22 are formed on first and second ends 14, 18 thereby providing handles for manually or automatedly moving the tray 10.

Figure 10:
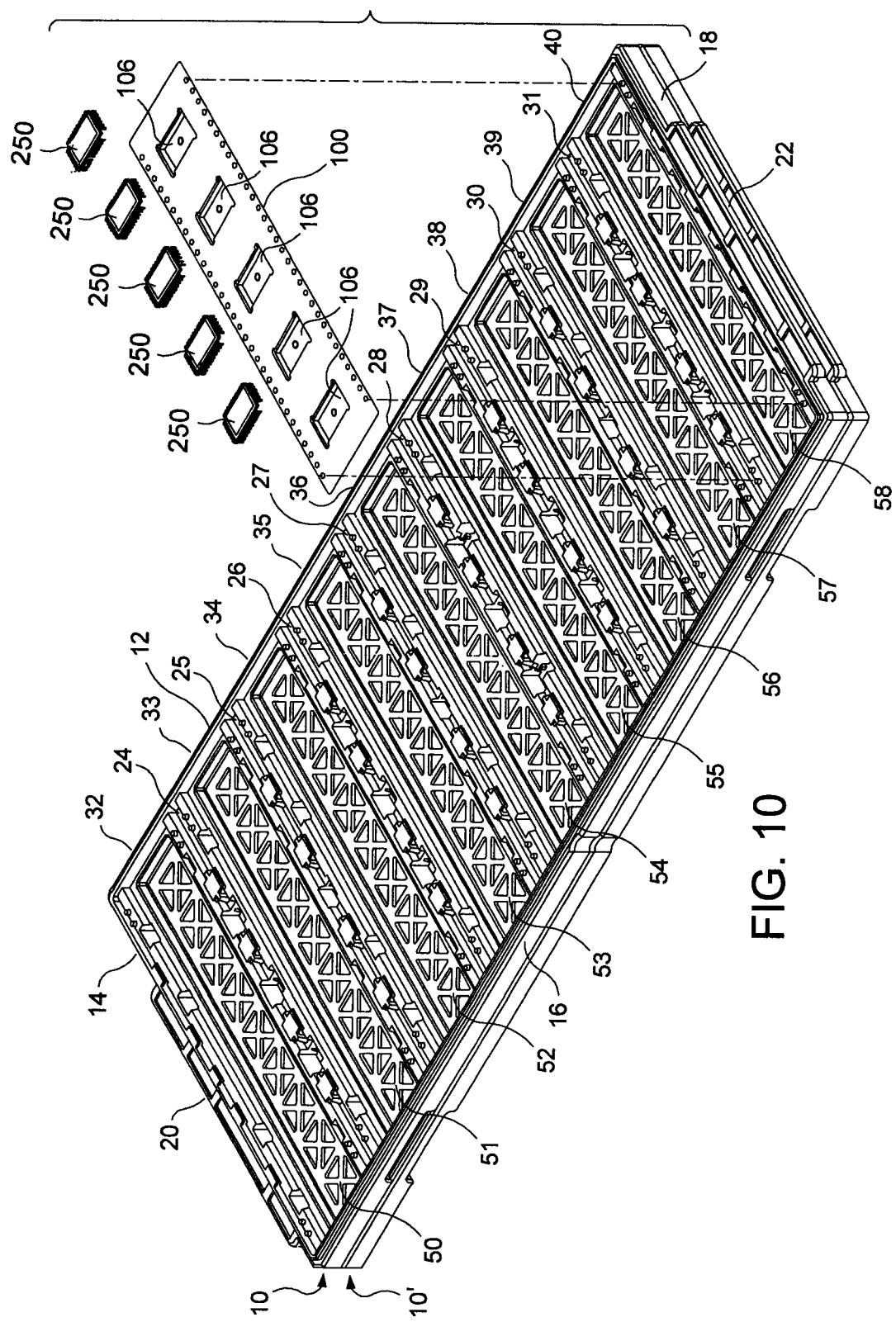
FIG. 10 is a top perspective exploded view of two stacked handling device of the still further embodiment of the present disclosure, including computer chips contained therewithin.
Figure 11:
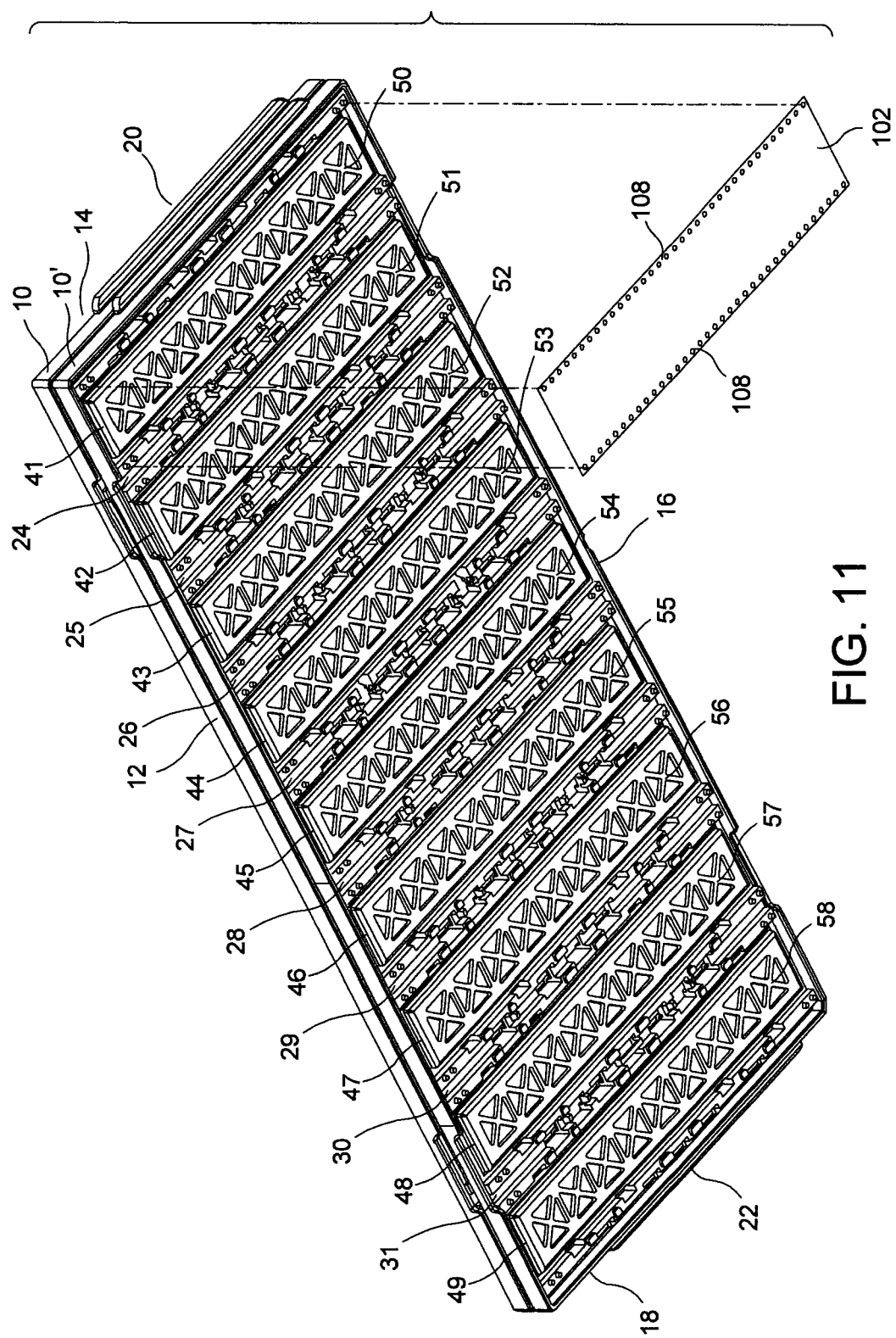
FIG. 11 is a bottom perspective exploded view of two stacked handling devices of the still further embodiment of the present disclosure, including computer chips contained therewithin.

The profiles of the first and second sides 12, 16 and the first and second ends 14, 18, are typically in accordance with the JEDEC standards with respect to outer stacking rail standards in order to provide for the stacking ability evidenced by FIGS. 10 and 11. Eight internal rails 24-31 extend between first and second sides 12, 16 thereby forming nine upper storage channels 32-40 on the upper surface, and in the embodiment shown in FIG. 9, further forms nine lower storage channels 41-49. Upper storage channels 32-40 are divided from lower storage channels 41-49 by lattice floor segments 50-58, respectively.

Figure 14:
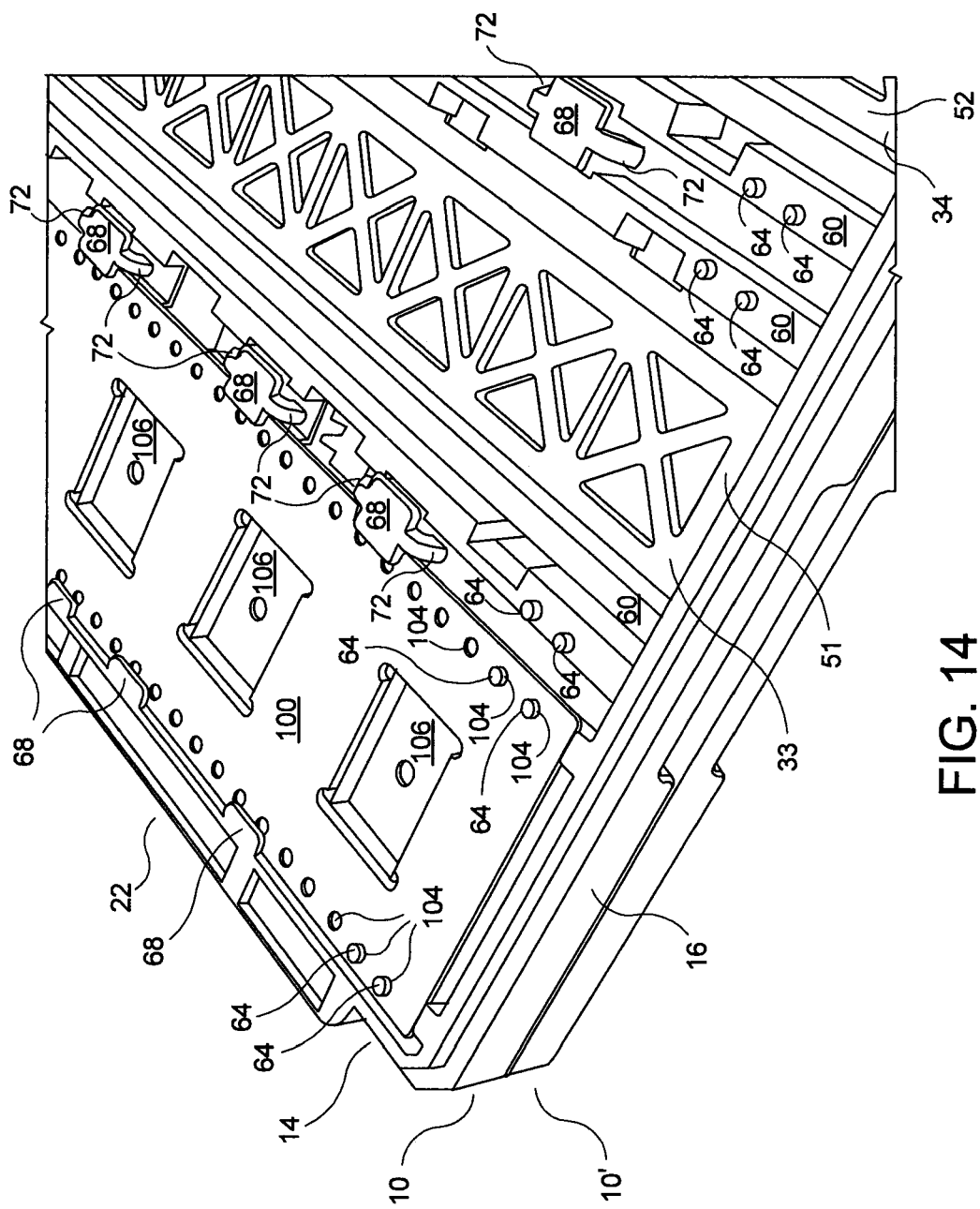
FIG. 14 is a perspective view of a corner of the still further embodiment of the handling device of the present disclosure, showing the use of a tape to hold computer chips.

Upper ledge 60 is formed along the interior surfaces of first and second ends 14, 18 as well as on the lateral surfaces of internal rails 24-31 on the upper surface as shown in FIG. 8. Similarly, lower ledge 62 is formed along the interior surfaces of first and second ends 14, 18 as well as on the lateral surfaces of internal rails 24-31 on the bottom surface as shown in FIG. 9. As shown in FIGS. 10 and 14, upper ledge 60 is used to support and position the periphery of upper thermoformed insert strips 100 while similarly, as shown in FIG. 11, lower ledge 62 is used to support and position the periphery of lower thermoformed insert strips 102 (insert strips 100, 102 may also be referred to as "tapes"). Upper pins 64 are formed on the upper ledge 60, on the interior surfaces of first and second ends 14, 18 as well as on both lateral surfaces of internal rails 24-31 inwardly adjacent from the first and second sides 12, 16. As shown in FIG. 10 and in further detail in FIG. 14, upper pins 64 engage the lateral sprocket apertures 104 of upper thermoformed insert strips 100 thereby positioning upper thermoformed insert strips 100 into upper storage channels 32-40. Upper thermoformed insert strips 100 further include pockets 106 for containing the various computer chips 250. The pockets 106 of upper thermoformed insert strips 100 can be provided in various dimensions to accommodate various sizes of computer chips 250. In other embodiments of the present disclosure, the pockets 106 can have any suitable distribution over the upper thermoformed insert strip 100 that is in compliance with JEDEC Design Guide 4.10, for example. Similarly, lower pins 66 are formed on the lower ledge 62, on the interior surfaces of first and second ends 14, 18 as well as on both lateral surfaces of internal rails 24-31 immediately inwardly adjacent from the first and second sides 12, 16. As shown in FIG. 11, lower pins 66 engage lateral sprocket apertures 108 of lower thermoformed insert strips 102 thereby positioning lower thermoformed insert strips 102 into lower storage channels 41-49. Lower thermoformed insert strip 102 is shown without any pockets thereby acting as a cover for the pockets 106 of an upper thermoformed insert strip 100 of an immediately lower tray 10' when in the stacked configuration as shown in FIGS. 10 and 11. However, some embodiments may include pockets within lower thermoformed insert strip 102. Furthermore, to assure that the computer chips 250 remain securely in place in the pockets 106, some embodiments or applications may place a foam strip or similar material (not shown) between the lower thermoformed insert strip 102 of a tray 10 and the upper thermoformed insert strip 100 of an immediately lower stacked tray 10'.

While the illustrated embodiment discloses nine upper storage channels 32-40 and nine lower storage channels 41-49, other embodiments may include different numbers of storage channels. For instance, while an embodiment employing thermoformed insert strips with a width of 32 mm. may have nine upper storage channels and nine lower storage channels (as illustrated), an embodiment employing thermoformed insert strips with a width of 24 mm. may have ten upper storage channels and ten lower storage channels. Similarly, an embodiment employing thermoformed insert strips with a width of 44 mm. may have eight upper storage channels and eight lower storage channels. Each thermoformed insert strip may have a centerline position for the computer chips which does not necessarily correspond to the highest chip density possible, but rather to a common chip density achieved by the largest possible chip density achieved by the largest possible chip fitting into that tape width. The center line position for that largest possible chip in the given tape width becomes the standard center line position for the given tape width. This is done so that a single set of testing hardware may be utilized for each tape width/tray system thereby saving set up time and test head expenses.

Furthermore, it can be seen that lower pins 66 are preferably offset from the corresponding position of upper pins 64. That is, lower pins 66 are more closely adjacent to first and second sides 12, 16 than are upper pins 64. This allows for the stacking of trays 10 as shown in FIGS. 10 and 11 without the upper and lower pins 64, 66 of adjacent trays interfering with each other.

Further, to maintain the upper and lower thermoformed insert strips 100, 102 in position, upper and lower clips 68, 70 are formed in spaced relation with respect to respective upper and lower ledges 60, 62 on the interior surfaces of ends 14, 18 as well as along the extent of both lateral surfaces of internal rails 24-31. As can be seen in FIG. 14, the upper clips 68 (and similarly lower clips 70) on ends 14, 18 protrude from the interior side of walls 14, 18 immediately above ledge 60 in order to form a space therebetween to engage upper thermoformed insert strip 100. However, the upper clips 68 (and similarly lower clips 70) formed on the lateral surfaces of internal rails 24-31 include stand-off fingers 72 to space the upper clips 68 from ledge 60 thereby creating a space therebetween to engage upper thermoformed insert strip 100. Additionally, while not shown in the figures, it is envisioned that in some embodiments, upper clips 68 may be offset from lower clips 70 (i.e., closer or further away from sides 12, 16) in order to prevent the upper and lower clips 70 of adjacent stacked trays from interfering with each other.

Figure 15:
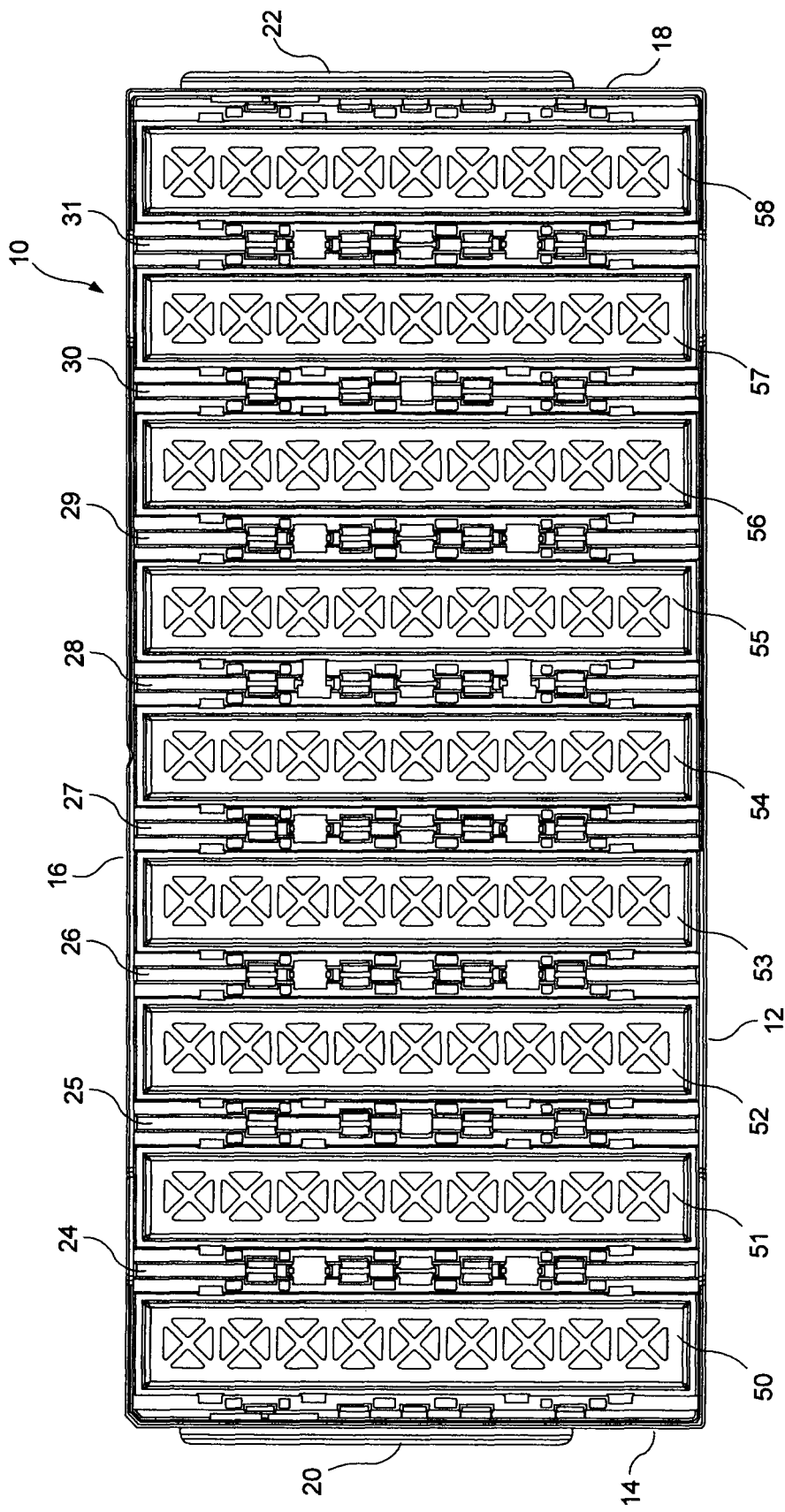
FIG. 15 is an alternative bottom view of the still further embodiment of the handling device of the present disclosure.

FIG. 15 discloses an alternative embodiment of the bottom of tray 10. In this alternative embodiment, the lower pins 66 and lower clips 70 are omitted (some vestiges may remain in place where the lower clips 70 would otherwise be formed) with a further view to omitting lower thermoformed insert strip 102. The bottom of the tray 10 can serve as a cover to the upper thermoformed insert strip 100 of an immediately lower adjacent stacked tray 10'.

In order to use tray 10, upper and lower thermoformed insert strips 100, 102 are placed into any or all of the upper and lower storage channels 32-40 and 41-49 (typically chosen so that the upper and thermoformed insert strips 100, 102 of adjacent stacked trays will abut each other) in a plurality of trays 10 so that the upper and lower pins 64, 66 engage the appropriate lateral sprocket apertures 104, 108 of upper and lower thermoformed insert strips 100, 102 and upper and lower clips 68, 70 engage the upper and lower thermoformed insert strips 100, 102 against the respective upper and lower ledges 60, 62. Computer chips 250 are placed into pockets 106 and the trays 10 are stacked successively one on top of the other. All of these operations can be done manually or with automation, or a combination of the two.

Thus the several aforementioned objects and advantages are most effectively attained. Although preferred embodiments of the invention have been disclosed and described in detail herein, it should be understood that this invention is in no sense limited thereby and its scope is to be determined by that of the appended claims.

What is claimed is:

1. A handling device for microelectronic assemblies, comprising:
    a frame including a first end element, a second end element, a first side element and a second side element;
    internal rails extending between the first side element and the second side element thereby defining storage channels within the handling device;
    a floor formed within the storage channels, thereby defining upper storage channels and lower storage channels, wherein the floor is between the upper storage channels and the lower storage channels;
    upper insert strips releasably attached to the internal rails within the upper storage channels, the upper insert strips including a plurality of pockets for receiving microelectronic assemblies; and
    lower insert strips releasably attached to the internal rails within the lower storage channels, wherein the lower insert strips present a flat continuous cover to the plurality of pockets on an upper insert strip of a lower adjacent stacked handling device.

2. The handling device of claim 1 wherein the upper insert strips are thermoformed.

3. The handling device of claim 2 wherein the lower insert strips are thermoformed.

4. The handling device of claim 1 further including upper pins in the upper storage channels for releasably attaching the upper insert strips and lower pins in the lower storage channels for releasably attaching the lower insert strips.

5. The handling device of claim 4 further including an upper ledge formed within the upper storage channels for positioning the upper insert strips and a lower ledge formed within the lower storage channels for positioning the lower insert strips.

6. The handling device of claim 5 wherein the upper pins are formed on the upper ledge and the lower pins are formed on the lower ledge.

7. The handling device of claim 6 wherein the upper insert strips include lateral apertures for receiving the upper pins and the lower insert strips include lateral apertures for receiving the lower pins.

8. The handling device of claim 7 wherein successive handling devices are capable of being stacked on each other.

9. The handling device of claim 8 wherein the upper pins are offset from the lower pins whereby the upper pins and lower pins of adjacent stacked handling devices are separated from each other.

10. The handling device of claim 9 further including upper clips in the upper storage channels for engaging the upper insert strips and lower clips in the lower storage channels for engaging the lower insert strips.

11. The handling device of claim 10 wherein a first portion of the upper and lower clips are separated from the upper and lower ledges, respectively, by stand-off fingers.

12. The handling device of claim 11 wherein a second portion of the upper and lower clips extend from the first end portion and the second end portion at positions separated from the upper and lower ledges.

13. The handling device of claim 1 further including first and second handles extending from the first and second end portions, respectively.

* * * * *